US010916691B2

(12) United States Patent
Nakamura et al.

(10) Patent No.: US 10,916,691 B2
(45) Date of Patent: Feb. 9, 2021

(54) MOTHER PIEZOELECTRIC ELEMENT, LAMINATED PIEZOELECTRIC ELEMENT, AND MANUFACTURING METHOD FOR LAMINATED PIEZOELECTRIC ELEMENT

(71) Applicant: Murata Manufacturing Co., Ltd., Nagaokakyo (JP)

(72) Inventors: Kimitoshi Nakamura, Nagaokakyo (JP); Hisanobu Nakashima, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 785 days.

(21) Appl. No.: 15/698,983

(22) Filed: Sep. 8, 2017

(65) Prior Publication Data
US 2018/0013054 A1  Jan. 11, 2018

Related U.S. Application Data

(63) Continuation of application No. PCT/JP2016/059612, filed on Mar. 25, 2016.

(30) Foreign Application Priority Data

Mar. 30, 2015  (JP) ................. 2015-069384

(51) Int. Cl.
H01L 41/047  (2006.01)
H01L 41/338  (2013.01)
H01L 41/257  (2013.01)

(52) U.S. Cl.
CPC ........ H01L 41/047 (2013.01); H01L 41/0471 (2013.01); H01L 41/0472 (2013.01); H01L 41/257 (2013.01); H01L 41/338 (2013.01)

(58) Field of Classification Search
CPC . H01L 41/047; H01L 41/338; H01L 41/0472; H01L 41/0471
See application file for complete search history.

(56) References Cited

U.S. PATENT DOCUMENTS 9,246,081 B2    1/2016 Ohnishi et al.
2005/0280336 A1* 12/2005 Mochizuki .......... H01L 41/0472
                                                           310/366

(Continued)

FOREIGN PATENT DOCUMENTS

JP    2010-161286 A    7/2010
JP    2010-186902 A    8/2010

(Continued)

OTHER PUBLICATIONS

International Search Report issued in International Patent Application No. PCT/JP2016/059612, dated Jun. 14, 2016.

(Continued)

Primary Examiner — Bryan P Gordon
(74) Attorney, Agent, or Firm — Arent Fox LLP

(57) ABSTRACT

The structure of a mother piezoelectric element allows a polarization process to be performed on the mother body before the individual piezoelectric elements are cut from the mother piezoelectric element. The mother piezoelectric element includes a plurality of first internal electrodes which are provided on at least one first surface and a plurality of second internal electrodes which are provided on at least one second surface. Each of the first and second internal electrodes is led out to any of first to fourth side surfaces of a mother piezoelectric body. The plurality of first internal electrodes are electrically connected to each other on a first surface and the plurality of second internal electrodes are electrical connected to each other on a second surface. All the first internal electrodes in the mother piezoelectric body are electrically connected to each other, and all the second (Continued)

internal electrodes in the mother piezoelectric body are electrically connected to each other.

20 Claims, 11 Drawing Sheets

(56) References Cited

U.S. PATENT DOCUMENTS

| | | | |
|---|---|---|---|
| 2006/0076650 A1* | 4/2006 | Osawa | H01L 41/297 257/620 |
| 2011/0031848 A1* | 2/2011 | Sakai | H01L 41/0913 310/366 |
| 2012/0117769 A1 | 5/2012 | Ohnishi et al. | |
| 2014/0293503 A1* | 10/2014 | Sasabayashi | H01G 4/30 361/301.4 |
| 2014/0375173 A1* | 12/2014 | Hamanaka | H01G 4/2325 310/363 |
| 2015/0102708 A1* | 4/2015 | Kim | H01L 41/0471 310/365 |
| 2016/0099400 A1* | 4/2016 | Uetani | H01L 41/083 310/363 |

FOREIGN PATENT DOCUMENTS

| | | |
|---|---|---|
| JP | 2012-104715 A | 5/2012 |
| JP | 2015-012089 A | 1/2015 |
| WO | WO 2013/065657 A1 | 5/2013 |

OTHER PUBLICATIONS

Written Opinion of the International Searching Authority issued in International Patent Application No. PCT/JP2016/059612, dated Jun. 14, 2016.

* cited by examiner

FIG. 1
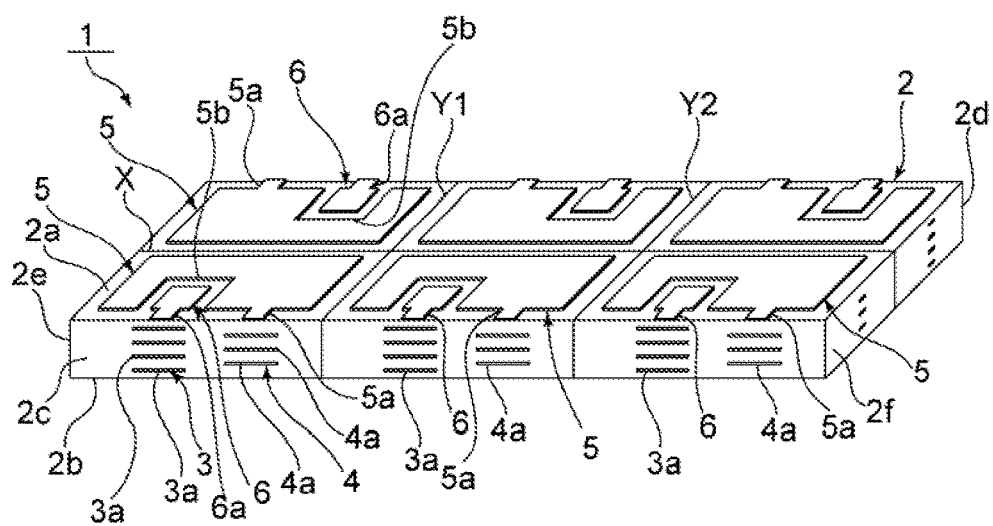
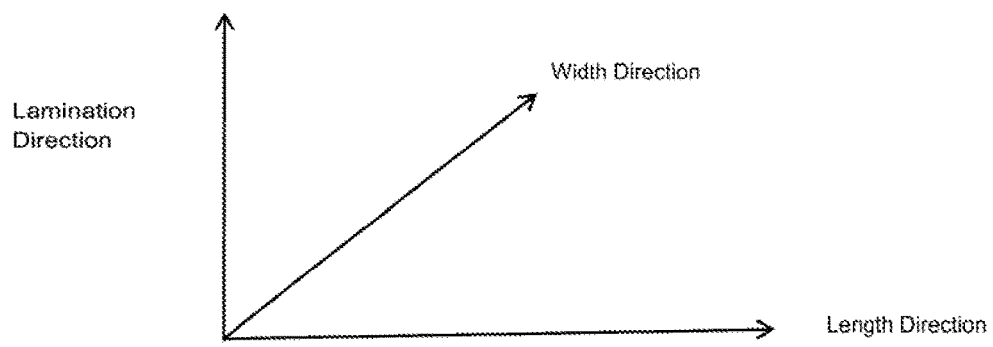

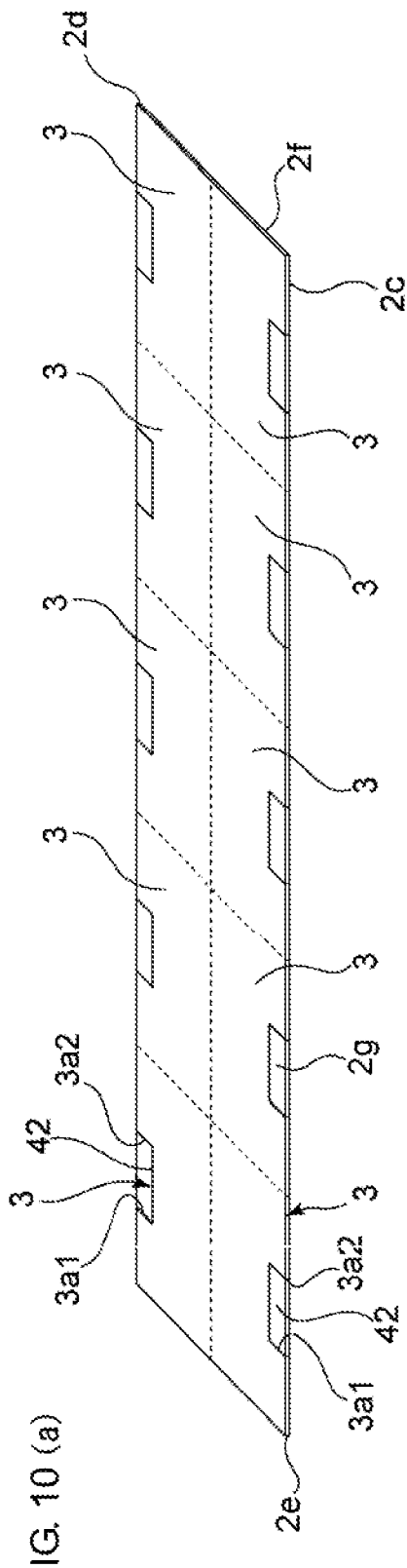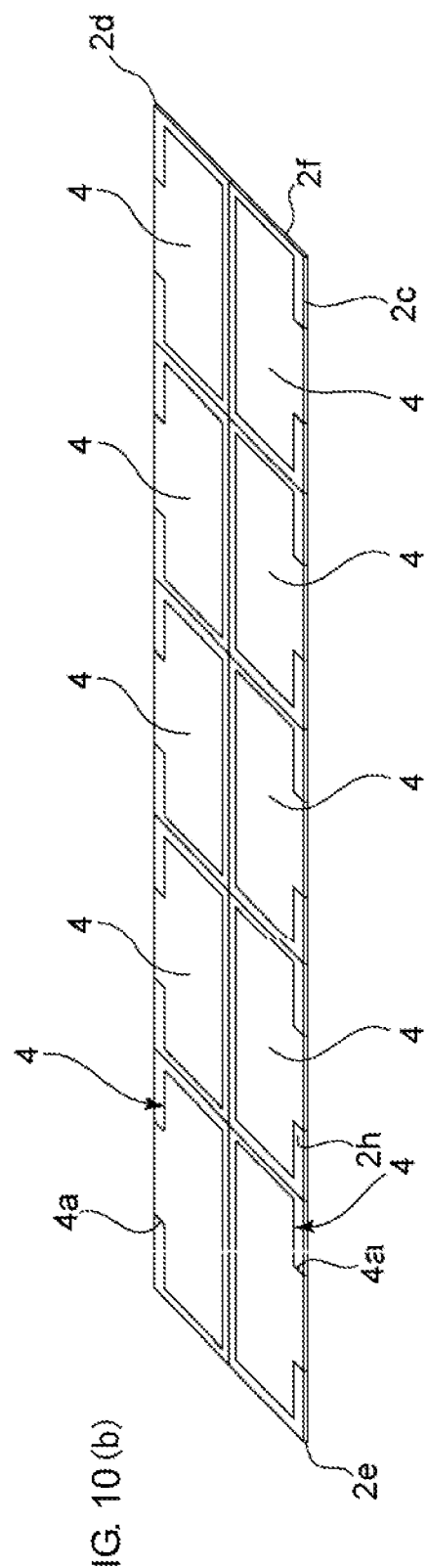

MOTHER PIEZOELECTRIC ELEMENT, LAMINATED PIEZOELECTRIC ELEMENT, AND MANUFACTURING METHOD FOR LAMINATED PIEZOELECTRIC ELEMENT

CROSS REFERENCE TO RELATED APPLICATIONS

The present application is a continuation of International application No. PCT/JP2016/059612, filed Mar. 25, 2016, which claims priority to Japanese Patent Application No. 2015-069384, filed Mar. 30, 2015, the entire contents of each of which are incorporated herein by reference.

TECHNICAL FIELD

The present invention relates to a mother piezoelectric element for obtaining a laminated piezoelectric element, the laminated piezoelectric element, and a manufacturing method for the laminated piezoelectric element.

BACKGROUND ART

Various piezoelectric elements using laminated piezoelectric ceramics have been proposed. A piezoelectric element disclosed in Japanese Patent Laid-Open No. 2010-186902 has a rectangular parallelepiped piezoelectric body having a plurality of first internal electrodes and a plurality of second internal electrodes laminated through piezoelectric layers. The piezoelectric layer between the first internal electrode and the second internal electrode is polarized in a laminating direction.

In the foregoing piezoelectric element, a pair of side edges of the first internal electrode and a pair of side edges of the second internal electrode are each arranged with a gap from side surfaces of the piezoelectric body. The first and second internal electrodes are not exposed to the side surfaces of the piezoelectric body, thereby alleviating a reduction in insulation resistance.

In manufacturing the above piezoelectric element, it is necessary to polarize the piezoelectric body. As for a laminated electronics part, a method of preparing a mother element and dividing it into individual elements is commonly used to improve mass productivity. In the piezoelectric element disclosed in the foregoing Japanese Laid-Open Patent, since the first and second internal electrodes are not exposed to the side surfaces of the piezoelectric body, a polarization treatment cannot be performed at a stage of the mother element. Therefore it is necessary to perform a polarization process after the mother element is divided into individual elements. This complicates the manufacturing process.

It is an object of the present invention to provide a mother piezoelectric element which is capable of performing a polarization process at a stage of a mother piezoelectric body and improving the productivity of a laminated piezoelectric element.

It is another object of the present invention to provide a laminated piezoelectric element which is obtained by performing the polarization process at the stage of the mother piezoelectric body and which is therefore easily manufactured, and provide a manufacturing method for the laminated piezoelectric element.

BRIEF SUMMARY OF THE INVENTION

In accordance with one embodiment, a mother piezoelectric element includes a mother piezoelectric body having (a) first and second planar main surfaces which are parallel and opposed to one another and (b) n side surfaces which extend between the first and second main surfaces, n being an integer greater than or equal to one.

M first internal electrodes are located in the mother piezoelectric body and lie in a first plane which is parallel to the first main surface. Each of the first internal electrodes have a respective first lead-out part, each first lead-out part extending to at least one of the n side surfaces. The first internal electrodes are electrically connected to one another by connection parts lying in the first plane.

M second internal electrodes are located in the mother piezoelectric body and lie in a second plane which is parallel to and spaced from the first plane. Each of the second internal electrodes has a respective second lead-out part, each second lead-out part extending to at least one of the n side surfaces.

Each of the first internal electrodes oppose a respective one of the second internal electrodes with a respective piezoelectric layer there between to form a respective electrode pair. The respective piezoelectric layers are preferably all part of a single piezoelectric layer.

M first connection electrodes are provided. Each first connection electrode is (a) located on at least one of the n side surfaces, (b) associated with a respective electrode pair and (c) electrically connected to the first internal electrode of its associated electrode pair.

M second connection electrodes are provided. Each second connection electrode is (a) located on at least one of the n side surfaces, (b) associated with a respective electrode pair and (c) electrically connected to the second internal electrode of its associated electrode pair.

In various embodiments, the first lead-out portions do not overlap the second lead-out portions as viewed in a direction normal to the first plane. In embodiments, the plurality of second internal electrodes are electrically connected to each other by conductive parts lying in the second plane. In preferred embodiments, the conductive parts lying in the first plane do not overlap the conductive parts lying in the second plane as viewed in a direction normal to the first plane.

Each electrode pair preferably has an overlapping region where the first and second internal electrodes overlap one another. At least one of the first and second internal electrodes of the electrode pair extends outwardly from the overlapping region.

In certain embodiments, the plurality of second internal electrodes are physically separated from each other.

In the preferred embodiments, the piezoelectric layers of the mother piezoelectric element are polarized.

In certain embodiments, the mother piezoelectric element also includes m main surface electrodes, each of the main surface electrodes being located on the first and/or second main surface. Each main surface electrode is opposed to a respective one of the first internal electrodes.

The invention is also directed towards a laminated piezoelectric element which is obtained by dividing the above described mother piezoelectric element.

The laminated element preferably includes a piezoelectric body in which a plurality of piezoelectric layers are laminated one on top of the other, the piezoelectric body having (a) first and second planar main surfaces which are parallel and opposed to one another and (b) n side surfaces which extend between the first and second main surfaces, n being an integer greater than or equal to one.

A plurality of first internal electrodes are located in the piezoelectric body. Each of the first internal electrodes lying in a respective plane which extends parallel to the first main surface and is spaced from the plane in which the other first internal electrodes lie. Each of the first internal electrodes has a respective first lead-out part which extends to at least one of the n side surfaces.

A plurality of second internal electrodes are located in the piezoelectric body. Each of the second internal electrodes lie in a respective plane which extends parallel to the first main surface and is spaced from the plane in which the other first and second internal electrodes lie. Each of the second internal electrodes has a respective second lead-out part which extends to at least one of the n side surfaces.

A first connection electrode is provided on at least one of the n side surfaces and is electrically connected to the plurality of first internal electrodes via their respective first lead-out parts.

A second connection electrode is provided on at least one of the n side surfaces of the piezoelectric body and is electrically connected to the plurality of second internal electrodes via their respective second lead-out parts. The first lead-out parts do not overlap the second lead-out parts as viewed in a direction normal to the first main surface.

The invention is also directed towards a manufacturing method for a plurality of laminated piezoelectric elements. The method preferably includes the following steps.

A DC voltage is applied across first and second connection electrodes of the above described mother piezoelectric element to polarize the mother piezoelectric body and then the mother piezoelectric element is divided to obtain the laminated piezoelectric element.

BRIEF DESCRIPTION OF DRAWINGS

FIG. 1 is a perspective view illustrating a mother piezoelectric element before forming first and second connection electrodes in a first embodiment of the present embodiment.

FIGS. 10(a) and 10(b) are schematic perspective views illustrating electrode structures on a first surface and a second surface in a mother piezoelectric body in the fourth embodiment, respectively.

DESCRIPTION OF EMBODIMENTS

Figure 2:
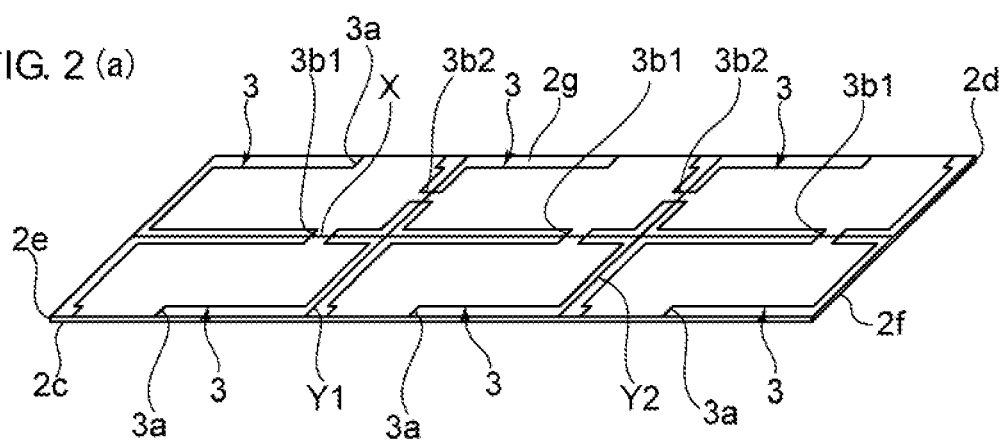
FIGS. 2(a) and 2(b) are schematic perspective views illustrating electrode structures formed on a first surface and a second surface in a mother piezoelectric body, respectively.
Figure 2:
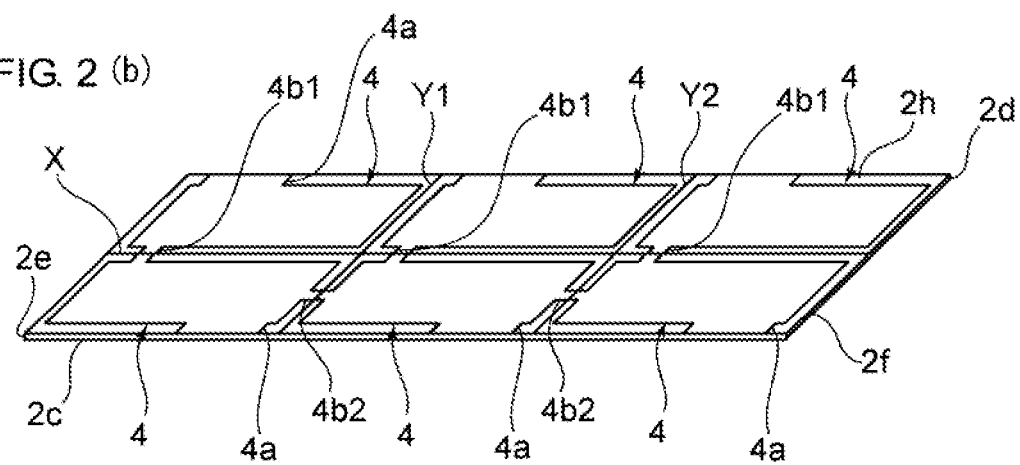

Hereinafter, specific, non-limiting, embodiments of the present invention will be described with reference to the drawings to clarify the present invention. Note that each embodiment described in the specification is illustrative and partial replacement or combination of configurations described in different embodiments can be made.

A manufacturing method for a laminated piezoelectric element according to a first embodiment of the present invention will be described with reference to FIGS. 1 to 5.

First, a mother piezoelectric element illustrated in FIG. 1 is prepared. Note that in FIG. 1, first and second connection electrodes, described later, have not yet been formed. As illustrated in FIG. 1, a mother piezoelectric element 1 has a mother piezoelectric body 2. The mother piezoelectric body 2 is made of piezoelectric ceramics such as lead titanate zirconate-based ceramics. Ultimately, the mother piezoelectric body 2 is divided along cut lines X, Y1, and Y2 indicated in FIG. 1 to form individual piezoelectric elements. The cut line X and the cut lines Y1, Y2 are drawn to indicate the boarders of these divided individual elements, but such lines are not actually drawn on the mother piezoelectric body 2.

The mother piezoelectric body 2 includes a first main surface 2a which opposes a second main surface 2b in a lamination direction of a piezoelectric layer, and first to fourth side surfaces 2c to 2f extending between the first and second main surfaces 2a and 2b.

The first side surface 2c is opposed to the second side surface 2d and the third side surface 2e is opposed to the fourth side surface 2f. The first side surface 2c and the second side surface 2d extend in a lengthwise direction of the mother piezoelectric body 2, and the third and fourth side surfaces 2e, 2f extend in a width direction of the mother piezoelectric body 2. Note that the mother piezoelectric body 2 may alternatively have a cubic shape.

A plurality of first internal electrodes 3 and a plurality of second internal electrodes 4 are formed in the mother piezoelectric body 2. The plurality of the first internal electrodes 3 are provided on at least a first internal surface 2g which extends parallel to the first main surface 2a, as illustrated in FIG. 2(a). Similarly, a plurality of second internal electrodes 4 are provided in the mother piezoelectric body 2 on at least one second surface 2h which also extends parallel to the first main surface 2a, as illustrated in FIG. 2(b). Respective pairs of first and second internal electrodes 3 and 4 oppose each other through a respective piezoelectric layer. The region where the first and second internal electrodes 3 and 4 opposed each other is referred to hereinafter as an overlapping region. In this embodiment, the overlapping region is rectangular in shape.

As illustrated in FIG. 2(a), each of the first internal electrodes 3 has a respective first lead-out part 3a which extends to either the first or the second side surfaces 2c, 2d of the mother piezoelectric body 2 from the respective overlapping region. Each of the second internal electrodes 4 also has a respective second lead-out part 4a which extends to either the first or second side surfaces 2c, 2d. As illustrated in FIG. 1, the first lead-out parts 3a and the second lead-out parts 4a are arranged not to overlap with each other in the laminating direction (shown in FIG. 1). In other words, the plurality of first lead-out parts 3a and the plurality of second lead-out parts 4a are spaced apart from each other in the lengthwise direction of the mother piezoelectric body 2 on either the first or second side surfaces 2c, 2d of the mother piezoelectric body 2. This is best shown in FIG. 1.

As best shown in FIG. 1, respective sets of first lead-out parts 3a overlap with each other in the lamination direction. Respective sets of second lead-out parts 4a also overlap with each other in the lamination direction.

As illustrated in FIG. 2(a), adjacent pairs of first internal electrodes 3 are electrically connected to each other by a respective first electrical connection part 3b1 or 3b2. More particularly, respective pairs of the first internal electrodes 3 which are adjacent to each other in the width direction are electrically connected to each other through a respective first electrical connection part 3b1 and respective pairs of the first internal electrodes 3 which are adjacent one another in the length direction (and which are located between the cut line X of the mother piezoelectric body 2 of the second side surface 2d) are electrically connected through a respective first electrical connection part 3b2. Accordingly, all the first internal electrodes 3 illustrated in FIG. 2(a) are electrically interconnected.

Similarly, as illustrated in FIG. 2(b), the second internal electrodes 4 which are adjacent to each other in the width direction are electrically connected through a respective second electrical connection part 4b1 and the respective second internal electrodes 4 which are located adjacent each other in the length direction (and which are located between the cut line X and the first side surface 2c) are electrically connected through a respective second electrical connection part 4b2. Thus, as illustrated in FIG. 2(b), all the second internal electrodes 4 on the second surface 2h are electrically interconnected.

As seen from FIGS. 2(a) and 2(b), the plurality of first electrical connection parts 3b1 and the plurality of second electrical connection parts 4b1 are spaced apart from each other in the lengthwise direction and thereby do not overlap each other in the lamination direction.

The first electrical connection parts 3b2 are located between the second side surface 2d and the cut line X and extend in the lengthwise direction. The second electrical connection parts 4b2 are located between the first side surface 2c and the cut line X and also extend in the lengthwise direction. Accordingly, the first and second electrical connection parts 3b2 and 4b2 are spaced apart from each other in the width direction and do not overlap with each other in the lamination direction.

While only two lamination layers, one containing first internal electrode layers 3, the other containing second internal electrode layers 4, are shown in FIGS. 2(a) and 2(b), the mother piezoelectric body 2 will typically have a plurality of such lamination layers stacked one above the other. In such a construction, a plurality of first electrical connection parts 3b1 will overlap with each other in the lamination direction as best shown in FIG. 1. Similarly, a plurality of first electrical connection parts 3b2 will also overlap with each other in the lamination direction as shown in FIG. 1. Likewise, a plurality of second electrical connection parts 4b1 will overlap with each other in the lamination direction and a plurality of second electrical connection parts 4b2 will overlap with each other in the lamination direction.

Returning back to FIG. 1, a plurality of main surface electrodes 5 are provided on the first main surface 2a of the mother piezoelectric body 2. Each main surface electrode 5 is located on a top surface of a respective laminated piezoelectric elements to be obtained by dividing the mother piezoelectric element 1.

Each main surface electrode 5 is opposed to a respective first internal electrode 3 located beneath the main surface electrode 5 and opposing the respective first internal electrode 3 through a respective piezoelectric layer. Accordingly, the piezoelectric layer located between the respective first internal electrode 3 and the respective main surface electrode 5 is also effectively used. Note that each main surface electrode 5 extends to a respective edge formed between the first main surface 2a and either the first or the second side surface 2c or 2d of the mother piezoelectric body 2. The part where the main surface electrode 5 is led out to the edge is referred to as a lead-out part 5a. Each lead-out part 5a overlaps with a respective set of second lead-out parts 4a of the second internal electrodes 4 in the lamination direction.

Each of the main surface electrodes 5 preferably has a respective recess part 5b opened to either the first or the second side surfaces 2b, 2c. A respective terminal electrode 6 is provided in each respective recess part 5b. None of the terminal electrodes 6 contact its respective main surface electrode 5 so that they are not electrically connected to their respective main surface electrode 5. The terminal electrode 6 extends to an edge formed between the first main surface 2a and either the first or second side surfaces 2c, 2d. Each lead-out part 6a of a respective terminal electrode 6 overlaps with a respective set of first lead-out parts 3a of the first internal electrode 3 in the lamination direction.

In the present embodiment, the main surface electrodes 5 are provided on the first main surface 2a. However, main surface electrodes may be also (or alternatively) provided on the second main surface 2b. Alternatively, the main surface electrodes 5 may be omitted.

The mother piezoelectric body 2 is typically formed by first printing the various conductive patterns (e.g., the first and second internal electrodes and the main surface electrodes) on respective ceramic lamination layers, stacking the layers one on top of the other to form a laminated body and then firing the so stacked layers.

Figure 3:
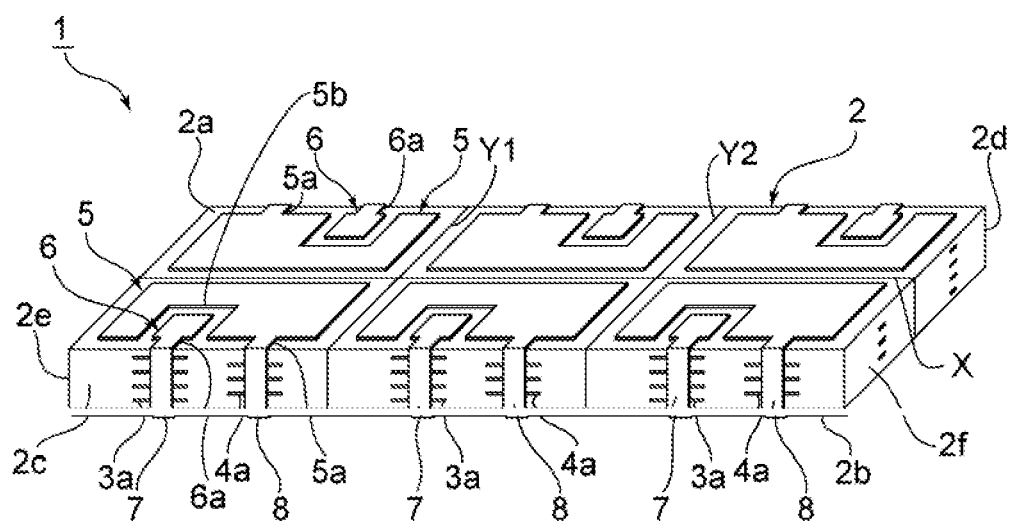
FIG. 3 is a perspective view illustrating the mother piezoelectric element according to the first embodiment of the present invention.

Next, as illustrated in FIG. 3, second connection electrodes 8 are formed on the first side surface 2c so as to be electrically connected to a respective lead-out part 5a and a respective set of second lead out parts 4a. First connection electrodes 7 are formed on the first side surface 2c so as to be electrically connected to respective lead-out part 6a and a respective set of first lead-out parts 3a. Accordingly, all the second internal electrodes 4 located in the mother piezoelectric body 2 are electrically connected to a respective second connection electrode 8.

The first connection electrodes 7 and the second connection electrodes 8 can be formed by spattering, vapor deposition, or the like, for example. The forming method is not particularly limited.

When a DC voltage is applied across all of the first and second connection electrodes 7, 8, a polarization voltage will be applied to each of the piezoelectric layers sandwiched between the first and second internal electrodes 3 and 4. As a result, polarization can be performed on the mother piezoelectric element 1 before it is divided into a plurality of individual laminated piezoelectric elements. Accordingly, a complicated polarization process is not required after dividing the mother piezoelectric element 1 into the plurality of individual piezoelectric elements. Thereby, the productivity can be effectively improved.

First and second connection electrodes are preferably also provided on the second side surface 2d side similarly to the first connection electrode 7 and the second connection electrode 8, but are not always required.

To perform the polarization process, the first connection electrode 7 and the second connection electrode 8 may be provided in a part where at least one laminated piezoelectric element is constituted in the mother piezoelectric body 2. Preferably, a respective set of first and second connection electrodes 7, 8 are provided for each of the individual laminated piezoelectric elements obtained by dividing the mother piezoelectric element 1. The first connection electrodes 7 are provided to connect the plurality of first internal electrodes 3 to each other, and the second connection electrodes are provided to connect the plurality of second internal electrodes 4 to each other.

Note that the first internal electrodes 3, the second internal electrodes 4, the main surface electrodes 5 and the terminal electrodes 6 can be formed by baking when conductive paste is printed and the ceramics is burnt. Such conductive paste can have a suitable composition containing metal powders such as Ag, Ag—Pd, Al, and Ni, an organic vehicle and a binder resin, for example. These electrodes may be formed not only by printing and baking the conductive paste but also vapor deposition, plating, or spattering. The first and second connection electrodes 7, 8 can be also formed by using suitable metals.

Next, the mother piezoelectric element 1 illustrated in FIG. 3 is cut along the cut lines X, Y1, Y2 described above to divide the mother piezoelectric element 1 into individual piezoelectric elements. Thus, an individual laminated piezoelectric element 11 illustrated in FIG. 4 is obtained.

Figure 5A:
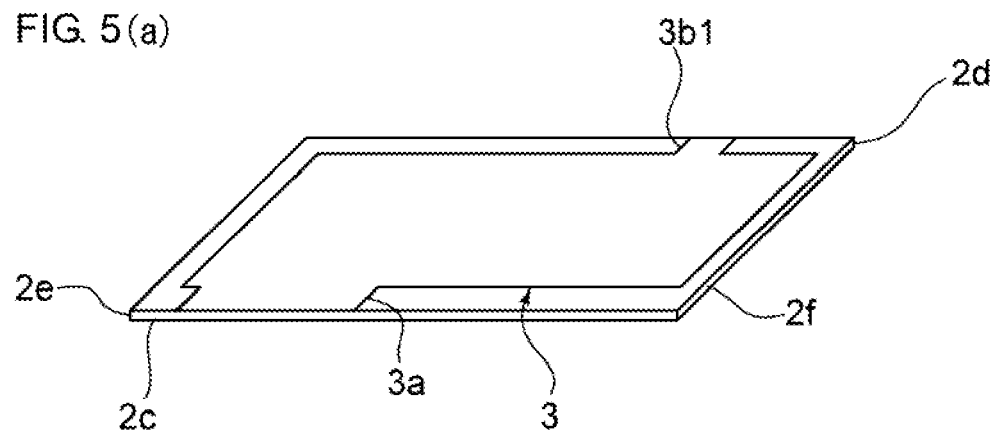
FIG. 5(a) and FIG. 5(b) are schematic perspective views for illustrating a first internal electrode and a second internal electrode in the first embodiment, respectively.
Figure 5B:
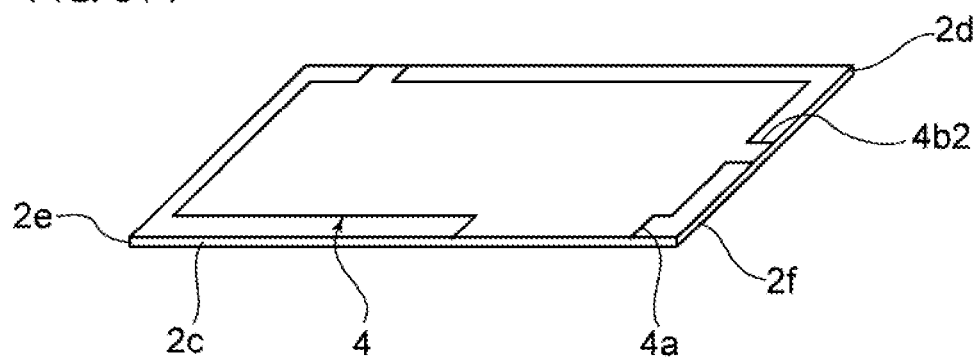

Note that FIGS. 5(a) and 5(b) are each a schematic perspective view illustrating preferred shapes of the first internal electrode 3 and the second internal electrode 4 in the laminated piezoelectric element 11 of the first embodiment.

Returning to FIG. 4, the laminated piezoelectric element 11 has a laminated piezoelectric body 2A. In the laminated piezoelectric body 2A, the plurality of first internal electrodes 3 and the plurality of second internal electrodes 4 are alternately laminated. The first connection electrode 7 is electrically connected to the terminal electrode 6. The second connection electrode 8 is electrically connected to the main surface electrode 5. Accordingly, a voltage is applied across the main surface electrode 5 and the terminal electrode 6, thereby enabling the laminated piezoelectric element 11 to be operated as, for example, a piezoelectric actuator. Note that the present invention can be applied to various laminated piezoelectric elements such as a laminated piezoelectric resonator without limiting to the piezoelectric actuator.

Figure 4:
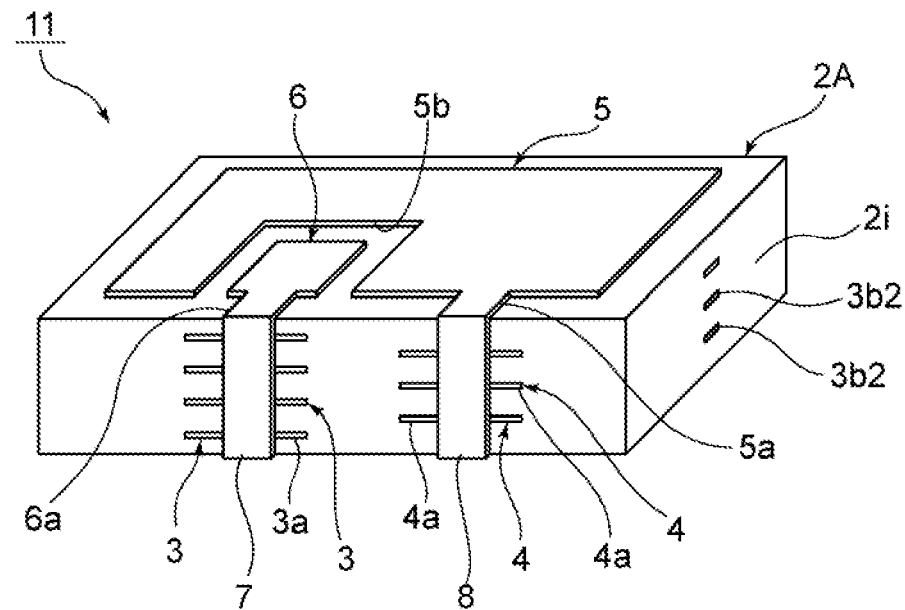
FIG. 4 is a perspective view illustrating a laminated piezoelectric element obtained in the first embodiment of the present invention.

As illustrated in FIG. 4, cut parts of the above-described first electrical connection parts 3b2 are exposed to one side surface 2i of the laminated piezoelectric body 2A.

Figure 6:
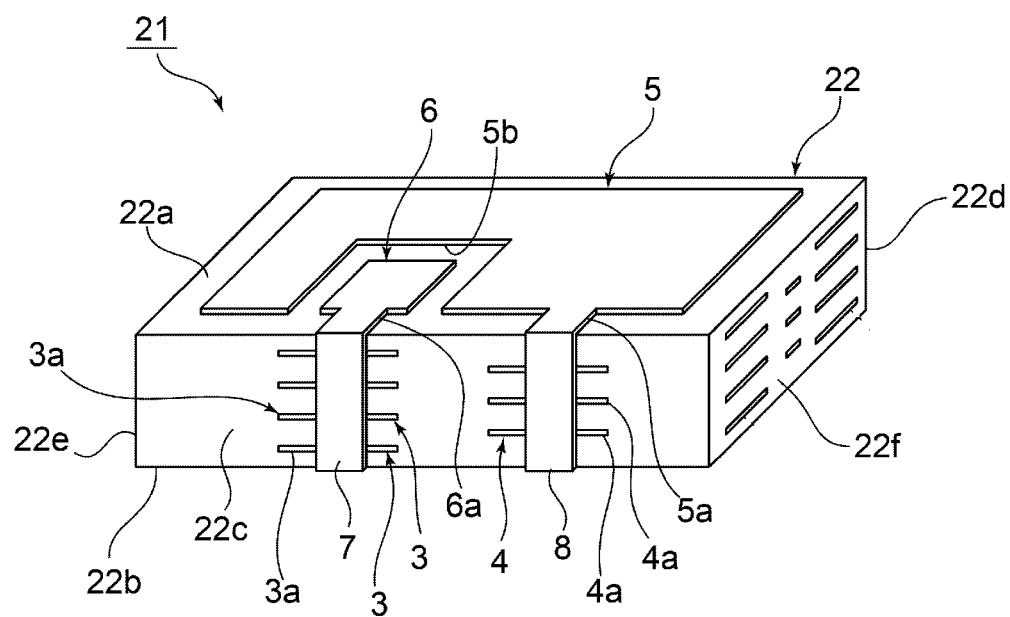
FIG. 6 is a perspective view illustrating a laminated piezoelectric element according to a second embodiment of the present invention.
Figure 7A:
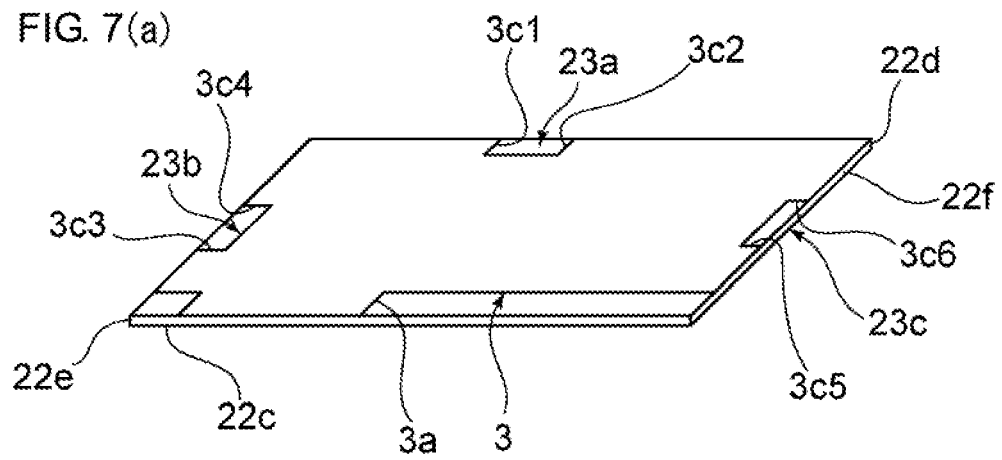
FIGS. 7(a) and 7(b) are schematic perspective views for illustrating a first internal electrode and a second internal electrode in the second embodiment, respectively.
Figure 7B:
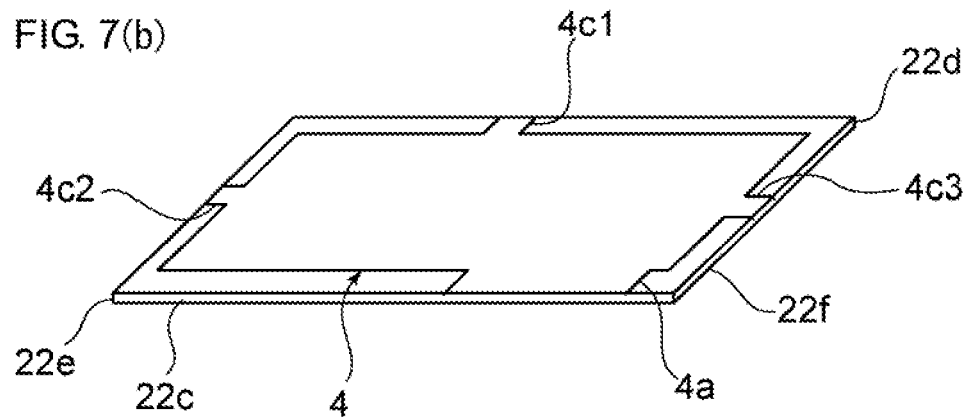

FIG. 6 is a perspective view of a laminated piezoelectric element according to a second embodiment of the present invention. FIGS. 7(a) and 7(b) are respective schematic perspective views for illustrating shapes of the first internal electrode and the second internal electrode in the second embodiment.

The laminated piezoelectric element 21 of the second embodiment has a piezoelectric body 22 which is similar to the laminated piezoelectric element 11 of the first embodiment except for the first internal electrode 3 and the second internal electrode 4 have different planar shapes than those of the first embodiment. Accordingly, the same parts are assigned the same reference numbers, and the descriptions thereof are omitted. As for each part of the piezoelectric body 22, a first main surface is denoted by 22a, a second main surface is denoted by 22b, and first to fourth side surfaces are denoted by 22c to 22f, respectively.

As illustrated in FIGS. 7(a) and 7(b), each first internal electrode 3 is opposed to a respective second internal electrode 4 through a piezoelectric layer in the laminating direction. An overlapping region which is the opposing region where the first internal electrode 3 and the second internal electrode 4 are opposed to each other has a rectangular planar shape like the first embodiment. The present embodiment differs from the first embodiment in that the first internal electrode 3 and the second internal electrode 4 are led out to all four side surfaces 22c to 22f of the piezoelectric body 22. To this end, the first internal electrode 3 includes lead-out parts 3c1 to 3c6. Lead-out parts 3c1, 3c2 are formed by providing a notch 23a facing (opened to) the second side surface 22d, and are located on opposite sides of the notch 23a. Similarly, lead-out parts 3c3, 3c4 are located on opposite sides of a notch 23b which faces (is opened to) the third side surface 22e. Lead-out parts 3c5, 3c6 are provided on body sides of a notch 23c and face (are opened to) the fourth side surface 22f. Accordingly, the first internal electrode 3 is led out to the first to fourth side surfaces 22c to 22f of the piezoelectric body 22 in a larger region outside the overlapping region.

The second internal electrode 4 further includes lead-out parts 4c1 to 4c3 formed by cutting of the second electrical connection parts. More particularly, the second internal electrode 4 has lead-out parts 4c1 to 4c3 which are led out to the second, third and fourth side surfaces 22d, 22e, and 22f, respectively, in addition to the second lead-out part 4a. The lead-out parts 4c1 to 4c3 are formed by cutting the second electrical connection parts formed when the individual piezoelectric elements are cut from the mother piezoelectric element. The lead-out parts 4c1 to 4c3 are located at positions corresponding to the notches 23a, 23b, and 23c, respectively, when viewed in the lamination direction. Therefore, the lead-out parts 3c1 to 3c6 of the first internal electrode 3 do not overlap the lead-out parts 4c1 to 4c3 in the laminating direction.

In the laminated piezoelectric element 21 of the second embodiment, the second internal electrode 4 is led out to a position outside the overlapping region in a larger region as compared with the first embodiment. Accordingly, an electrical field is also applied to outside of the overlapping region. Thus, a substantial effective region can be enlarged, and a larger displacement can be obtained. A large displacement can be obtained although the first internal electrode 3 is provided with a gap from the first to fourth side surfaces 22c to 22f of the piezoelectric body 22. The gap can effectively prevent a short circuit between the first internal electrode 3 and the second internal electrode 4.

Figure 8:
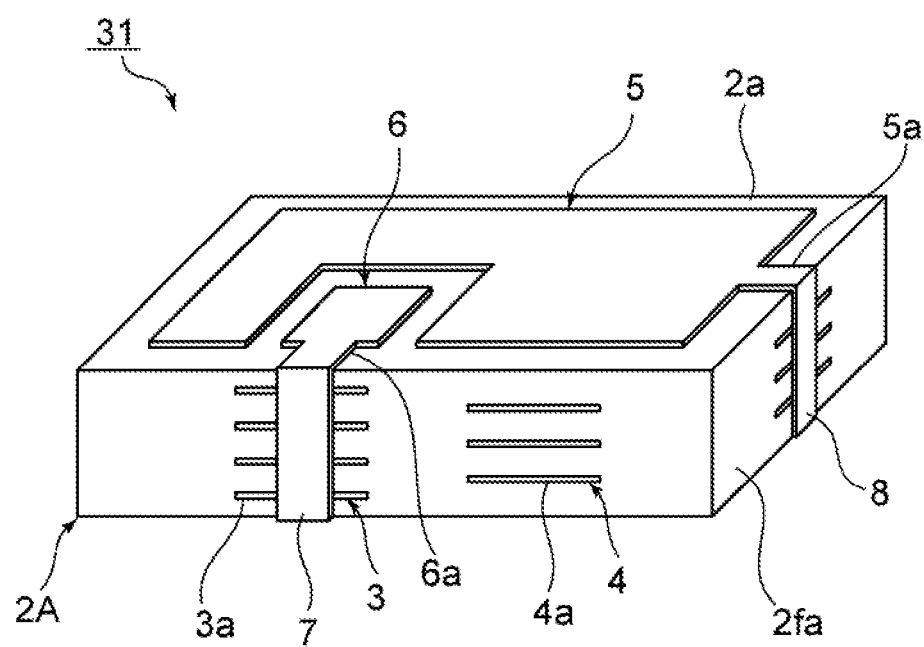
FIG. 8 is a perspective view illustrating a laminated piezoelectric element according to a third embodiment of the present embodiment.

FIG. 8 is a perspective view of a laminated piezoelectric element of a third embodiment of the present invention. A laminated piezoelectric element 31 of the third embodiment differs from that of the first embodiment in that the second connection electrode 8 is provided on a fourth side surface 2fa, and the lead-out part 5a is led out to an edge formed between the fourth side surface 2fa and the first main surface 2a.

The first connection electrode and the second connection electrode which are electrically connected to one of the first internal electrode and the second internal electrode may be provided on different side surfaces of the piezoelectric body.

Figure 9:
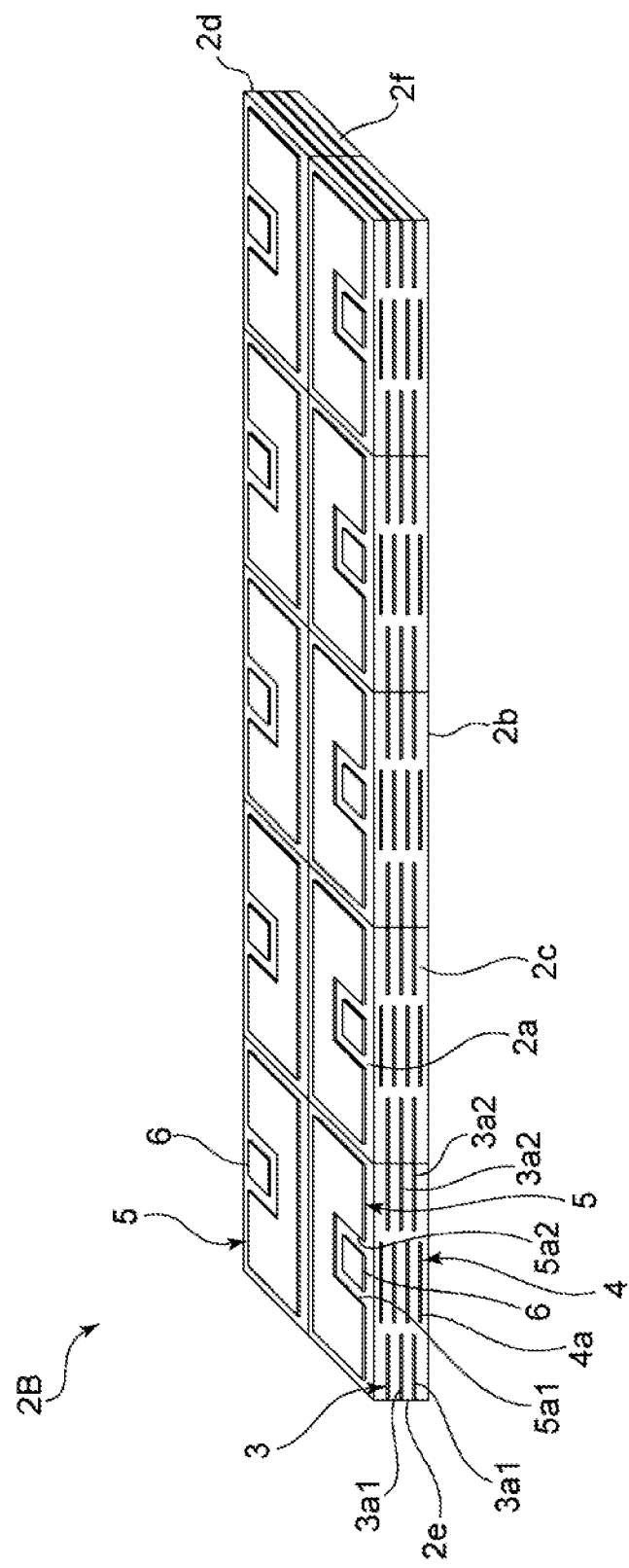
FIG. 9 is a perspective view illustrating a mother piezoelectric element before forming first and second connection electrodes in a fourth embodiment of the present embodiment.
Figure 11:
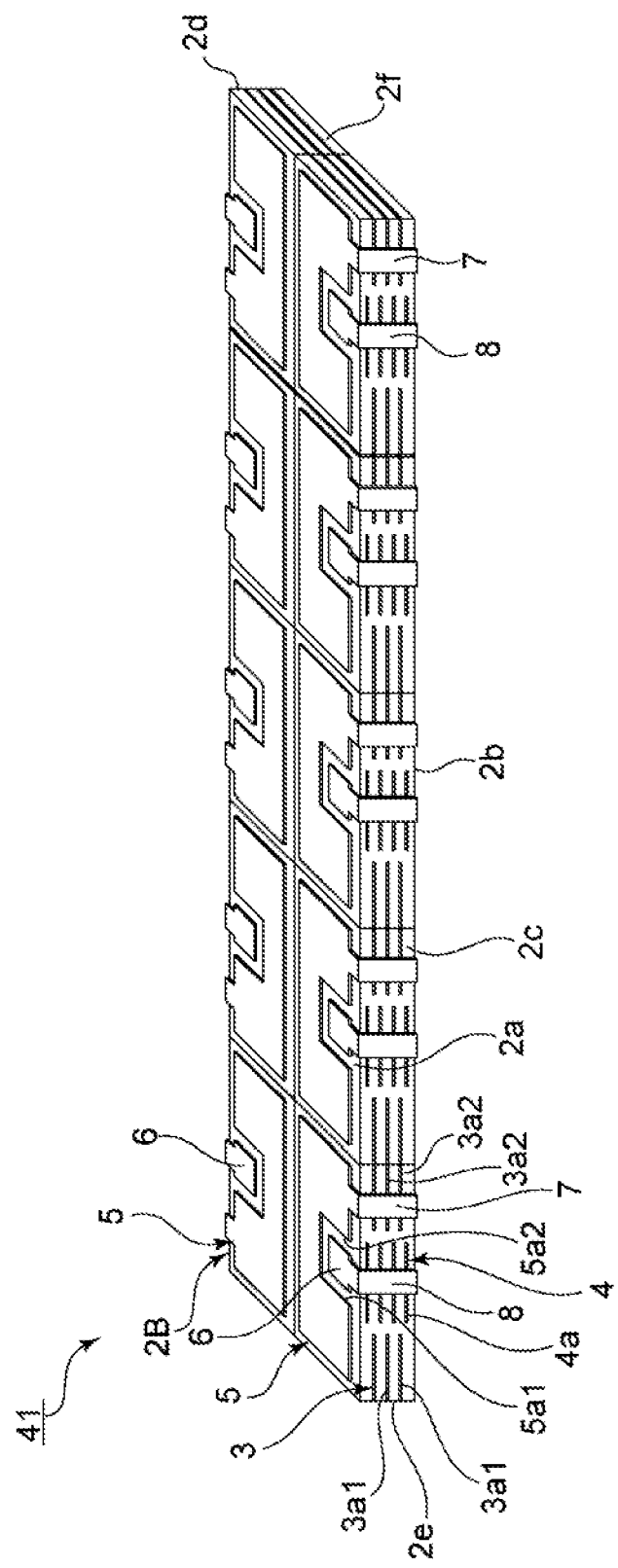
FIG. 11 is a perspective view illustrating the mother piezoelectric body according to the fourth embodiment.

FIG. 9 is a perspective view illustrating a mother piezoelectric element before forming first and second connection electrodes 7, 8 in a fourth embodiment of the present invention, and FIG. 11 is a perspective view illustrating the mother piezoelectric element according to the fourth embodiment. A mother piezoelectric element 41 according to the fourth embodiment has a mother piezoelectric body 2B. FIG. 10(a) and FIG. 10(b) are schematic perspective views illustrating electrode structures formed on a first surface and a second surface in the mother piezoelectric body 2B, respectively.

As illustrated in FIG. 10(a), a plurality of first internal electrodes 3 are provided on a first surface 2g of a respective ceramic layer. In this embodiment, the first internal electrodes 3 are integrally formed as a single contiguous electrical layer. The first internal electrodes 3 extend to the outer edges of the ceramic layer on which they are formed and extend beyond the region where they oppose their associated second internal electrode 4. Accordingly, the first internal electrode parts located outside the overlapping region serve as the first and second electrical connection parts 3b1 and 3b2 described above. Thereby, the plurality of first internal electrodes 3 are electrically connected to each other on the first surface 2g. Each of the first internal electrodes 3 has a respective pair of first lead-out parts 3a1, 3a2 which extend to the first or second side surface 2d, 2c. Notches 42 are provided between the respective pairs of first lead-out parts 3a1, 3a2.

As illustrated in FIG. 10(b), a plurality of second internal electrodes 4 are independently provided on a second surface 2h and are physically separated from one another. The present embodiment differs from the first embodiment in that the plurality of second internal electrodes 4 are not physically or electrically connected to each other on the second surface 2h.

Each of the second internal electrodes 4 has a respective second lead-out part 4a which extends to either the first or the second side surfaces 2c, 2d. The lead-out part 4a overlaps the notch 42 in the mother piezoelectric body 2 when viewed in the laminating direction. Accordingly, as illustrated in FIG. 9, each respective set of second lead-out parts 4a is located between a respective pair of sets of first lead-out parts 3a1, 3a2 on the first side surface 2c.

As also illustrated in FIG. 9, each main surface electrodes 5 and each of the terminal electrodes 6 are formed on the first main surface 2a of the mother piezoelectric body 2B. Each main surface electrode 5 has a pair of lead-out parts 5a1, 5a2. Each terminal electrode 6 is arranged in a recess between a respective pair of lead-out parts 5a1, 5a2.

As illustrated in FIG. 11, the pairs of first and second connection electrodes 7, 8 are provided in the mother piezoelectric element 41. Each first connection electrode 7 is provided so as to extend from a front surface of the first side surface 2c or the second side surface 2d (not illustrated) of the mother piezoelectric body 2B to a respective set of lead-out parts 5a1 or 5a2 of the main surface electrode 5. Thereby, respective sets of first internal electrodes 3 are electrically connected to a respective main surface electrode 5. In the present embodiment, the plurality of first internal electrodes 3 are electrically connected to each other on the first surface 2g. Accordingly, all the first internal electrodes 3 in the mother piezoelectric body 2B are electrically connected to one main surface electrode 5.

On the other hand, each second connection electrode 8 is electrically connected to a respective terminal electrode 6 through the first side surface 2c.

The plurality of second internal electrodes 4 are independently provided on the second surface 2h. Accordingly, in the present embodiment, to perform the polarization process, a voltage is applied only across any of main surface electrodes 5 and the corresponding terminal electrode 6 of the individual laminated piezoelectric element. Therefore, in the present embodiment, the polarization process can be performed at the stage of the mother piezoelectric element 41.

In the mother piezoelectric element 41, the plurality of second internal electrode 4 are not electrically connected to each other on the second surface 2h. Accordingly, at the stage of the mother piezoelectric element 41, the characteristics of individual laminated piezoelectric elements can be measured by connecting the plurality of first internal electrodes 3 as common terminals, that is, the main surface electrodes 5 as common terminals to the second connection electrode 8 of each laminated piezoelectric element. The individual laminated piezoelectric elements can be sorted before dividing the mother piezoelectric element 41 into individual laminated piezoelectric elements.

Figure 12:
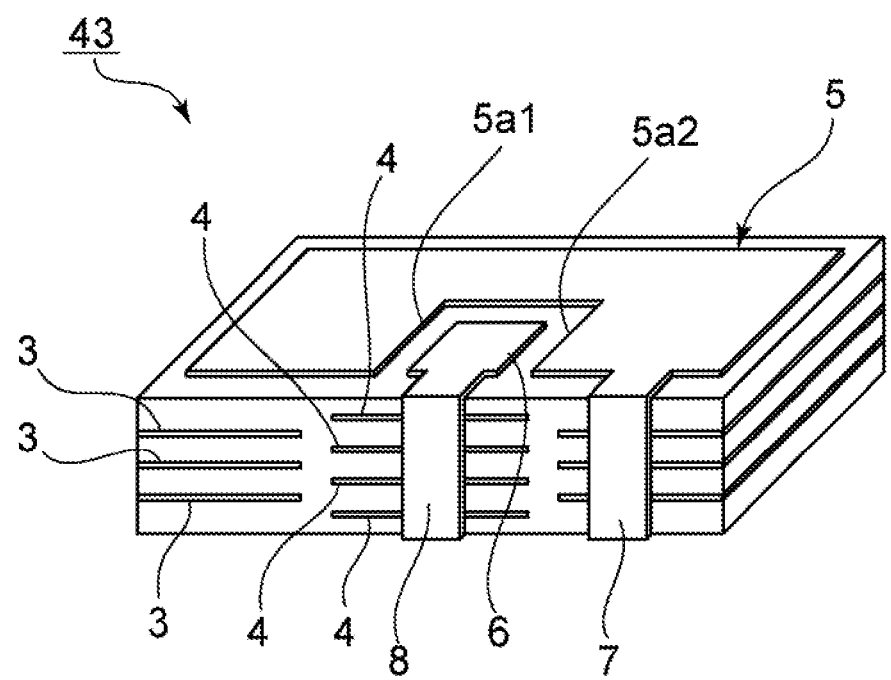
FIG. 12 is a perspective view illustrating a laminated piezoelectric body obtained in the fourth embodiment.

A laminated piezoelectric element 43 illustrated in FIG. 12 can be obtained by dividing the mother piezoelectric element 41.

In other respects, the fourth embodiment is the same as the first embodiment, the same parts are assigned the same reference numbers, and the descriptions thereof are omitted.

REFERENCE SIGNS LIST 1, 41 . . . Mother piezoelectric element
2, 2B . . . Mother piezoelectric body
2A . . . Laminated piezoelectric body
2a . . . First main surface
2b . . . Second main surface
2c to 2f . . . First to fourth side surfaces
2fa . . . Fourth side surface
2g, 2h . . . First and second surfaces
2i . . . Side surface
3 . . . First internal electrode
3a1, 3a2 . . . First lead-out part
3a . . . First lead-out part
3b1, 3b2 . . . First electric connection part
3c1 to 3c6, 4c1 to 4c3 . . . Lead-out part
4 . . . Second internal electrode
4a . . . Second lead-out part
4b1, 4b2 . . . Second electrical connection part
5, 5a1, 5a2 . . . Main surface electrode
5a . . . Lead-out part
5b . . . Recess part
6 . . . Terminal electrode
6a . . . Lead-out part
7, 8 . . . First and second connection electrodes
11, 21, 31, 43 . . . Laminated piezoelectric element
22 . . . Piezoelectric body
22a . . . First main surface
22b . . . Second main surface
22c to 22f . . . First to fourth side surfaces
23a, 23b, 23c, 42 . . . Notch
43 . . . Laminated piezoelectric element
X, Y1, Y2 . . . Cut line

The invention claimed is:
1. A mother piezoelectric element, comprising:
a mother piezoelectric body having (a) first and second planar main surfaces which are parallel and opposed to one another and (b) n side surfaces which extend between the first and second main surfaces, n being an integer greater than or equal to one;
m first internal electrodes located in the mother piezoelectric body and lying in a first plane which is parallel to the first main surface, each of the first internal electrodes having a respective first lead-out part, each first lead-out part extending to at least one of the n side surfaces, the first internal electrodes being electrically connected to one another by connection parts lying in the first plane;

m second internal electrodes located in the mother piezoelectric body and lying in a second plane which is parallel to and spaced from the first plane, each of the second internal electrodes having a respective second lead-out part, each second lead-out part extending to at least one of the n side surfaces;

each of the first internal electrodes opposing a respective one of the second internal electrodes with a respective piezoelectric layer there between to form a respective electrode pair;

m first connection electrodes, each first connection electrode being (a) located on at least one of the n side surfaces, (b) associated with a respective electrode pair and (c) electrically connected to the first internal electrode of its associated electrode pair; and m second connection electrodes, each second connection electrode being (a) located on at least one of the n side surfaces, (b) associated with a respective electrode pair and (c) electrically connected to the second internal electrode of its associated electrode pair.

2. The mother piezoelectric element according to claim 1, wherein the first lead-out portions do not overlap the second lead-out portions as viewed in a direction normal to the first plane.

3. The mother piezoelectric element according to claim 1, wherein the plurality of second internal electrodes are electrically connected to each other by conductive parts lying in the second plane.

4. The mother piezoelectric element according to claim 3, wherein the conductive parts lying in the first plane do not overlap the conductive parts lying in the second plane as viewed in a direction normal to the first plane.

5. The mother piezoelectric element according to claim 1, wherein:
each electrode pair has an overlapping region where the first and second internal electrodes overlap one another; and
at least one of the first and second internal electrodes of the electrode pair extends outwardly from the overlapping region.

6. The mother piezoelectric element according to claim 1, wherein the plurality of second internal electrodes are physically separated from each other.

7. The mother piezoelectric element according to claim 1, wherein the piezoelectric layers are polarized.

8. The mother piezoelectric element according to claim 1, further including m main surface electrodes, each of the main surface electrodes being located on the first and/or second main surface, each main surface electrode being opposed to a respective one of the first internal electrodes.

9. The mother piezoelectric element according to claim 1, wherein the respective piezoelectric layers are all part of a single piezoelectric layer.

10. A laminated piezoelectric element which is obtained by dividing the mother piezoelectric element according to claim 1.

11. A laminated piezoelectric element, comprising:
a piezoelectric body in which a plurality of piezoelectric layers are laminated one on top of the other, the piezoelectric body having (a) first and second planar main surfaces which are parallel and opposed to one another and (b) n side surfaces which extend between the first and second main surfaces, n being an integer greater than or equal to one;

a plurality of first internal electrodes located in the piezoelectric body, each of the first internal electrodes lying in a respective plane which extends parallel to the first main surface and is spaced from the plane in which the other first internal electrodes lie, each of the first internal electrodes having a respective first lead-out part which extends to at least one of the n side surfaces;

a plurality of second internal electrodes located in the piezoelectric body, each of the second internal electrodes lying in a respective plane which extends parallel to the first main surface and is spaced from the plane in which the other first and second internal electrodes lie, each of the second internal electrodes having a respective second lead-out part which extends to at least one of the n side surfaces;

a first connection electrode which is provided on at least one of the n side surfaces and which is electrically connected to the plurality of first internal electrodes via their respective first lead-out parts; and a second connection electrode which is provided on at least one of the n side surfaces of the piezoelectric body and which is electrically connected to the plurality of second internal electrodes via their respective second lead-out parts; and the first lead-out parts do not overlap the second lead-out parts as viewed in a direction normal to the first main surface.

12. A manufacturing method for a plurality of laminated piezoelectric elements comprising the steps of:
applying a DC voltage across first and second connection electrodes of a mother piezoelectric element having the structure of claim 1 to polarize the mother piezoelectric body; and
dividing the mother piezoelectric element to obtain the laminated piezoelectric element.

13. The method according to claim 12, wherein the first lead-out portions do not overlap the second lead-out portions as viewed in a direction normal to the first plane.

14. The method according to claim 12, wherein the plurality of second internal electrodes are electrically connected to each other by conductive parts lying in the second plane.

15. The method according to claim 13, wherein the conductive parts lying in the first plane do not overlap the conductive parts lying in the second plane as viewed in a direction normal to the first plane.

16. The method according to claim 12, wherein:
each electrode pair has an overlapping region where the first and second internal electrodes overlap one another; and
at least one of the first and second internal electrodes of the electrode pair extends outwardly from the overlapping region.

17. The method according to claim 12, wherein the plurality of second internal electrodes are physically separated from each other.

18. The method according to claim 12, wherein the piezoelectric layers are polarized.

19. The method according to claim 12, further including m main surface electrodes, each of the main surface electrodes being located on the first and/or second main surface, each main surface electrode being opposed to a respective one of the first internal electrodes.

20. The method according to claim 12, wherein the respective piezoelectric layers are all part of a single piezoelectric layer.

* * * * *